United States Patent
Cha et al.

(10) Patent No.: US 12,360,171 B2
(45) Date of Patent: Jul. 15, 2025

(54) BATTERY DIAGNOSING APPARATUS AND METHOD

(71) Applicant: LG Energy Solution, Ltd., Seoul (KR)

(72) Inventors: A-Ming Cha, Daejeon (KR); Yoon-Jung Bae, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 137 days.

(21) Appl. No.: 17/920,863

(22) PCT Filed: Nov. 12, 2021

(86) PCT No.: PCT/KR2021/016581
§ 371 (c)(1),
(2) Date: Oct. 24, 2022

(87) PCT Pub. No.: WO2022/103213
PCT Pub. Date: May 19, 2022

(65) Prior Publication Data
US 2023/0160971 A1 May 25, 2023

(30) Foreign Application Priority Data
Nov. 13, 2020 (KR) .................. 10-2020-0152317

(51) Int. Cl.
*G01R 31/392* (2019.01)
*G01R 31/3835* (2019.01)
*H01M 10/42* (2006.01)

(52) U.S. Cl.
CPC ....... *G01R 31/392* (2019.01); *G01R 31/3835* (2019.01); *H01M 10/4285* (2013.01)

(58) Field of Classification Search
CPC .......................... G01R 31/392; G01R 31/3835
See application file for complete search history.

(56) References Cited

U.S. PATENT DOCUMENTS 9,263,906 B2 * 2/2016 Takahashi ............ H02J 7/00
2007/0079701 A1 4/2007 Sayers et al.
(Continued)

FOREIGN PATENT DOCUMENTS

| CN | 106198453 B | 3/2019 |
| CN | 109946616 A | 6/2019 |

(Continued)

OTHER PUBLICATIONS

Bloom, I et al., "Differential voltage analyses of high-power, lithium-ion cells—1. Technique and application", Journal of Power Sources, Elsevier, Amsterdam, NL, vol. 139, No. 1-2, Sep. 16, 2004, pp. 295-303, XP004694581.

(Continued)

*Primary Examiner* — Walter L Lindsay, Jr.
*Assistant Examiner* — Milton Gonzalez
(74) *Attorney, Agent, or Firm* — Lerner David LLP (57) ABSTRACT

A battery diagnosing apparatus includes a profile generating unit configured to obtain a battery profile representing a corresponding relationship between voltage and capacity of a battery, and generate a differential profile representing a corresponding relationship between the voltage and a differential capacity for the voltage based on the obtained battery profile, and a control unit configured to receive the differential profile from the profile generating unit, determine a target peak in the differential profile, compare voltages of the determined target peak and a criterion peak of a criterion profile preset for the battery, and judge whether a side reaction occurs in the battery based on the comparison result.

16 Claims, 6 Drawing Sheets

(56) References Cited

U.S. PATENT DOCUMENTS

| | | |
|---|---|---|
| 2012/0169288 A1 | 7/2012 | Ueki et al. |
| 2013/0119940 A1 | 5/2013 | Iriyama et al. |
| 2013/0335009 A1 | 12/2013 | Katsumata et al. |
| 2016/0061908 A1 | 3/2016 | Torai et al. |
| 2018/0145528 A1 | 5/2018 | Oh et al. |
| 2021/0156923 A1 | 5/2021 | Nam et al. |
| 2022/0342003 A1* | 10/2022 | Pilipili Matady ..... H01M 10/44 |

FOREIGN PATENT DOCUMENTS

| | | | |
|---|---|---|---|
| JP | 2009511118 A | | 3/2009 |
| JP | 2011228213 A | * | 11/2011 |
| JP | 5682955 B2 | | 3/2015 |
| JP | 2015230817 A | | 12/2015 |
| JP | 2017133870 A | | 8/2017 |
| JP | 6314043 B2 | | 4/2018 |
| JP | 2018073755 A | | 5/2018 |
| JP | 2018205139 A | | 12/2018 |
| JP | 2019096552 A | | 6/2019 |
| JP | 6607167 B2 | | 11/2019 |
| KR | 20130142884 A | | 12/2013 |
| KR | 20160026766 A | | 3/2016 |
| KR | 20180057275 A | | 5/2018 |
| KR | 20190084686 A | | 7/2019 |
| WO | 2011036760 A1 | | 3/2011 |

OTHER PUBLICATIONS

Dahn, H.M. et al., "User-Friendly Differential Voltage Analysis Freeware for the Analysis of Degradation Mechanisms in Li-Ion Batteries", Journal of The Electrochemical Society, Aug. 14, 2012, pp. A1405-A1409, vol. 159 No. 9, XP055249350.

Extended European Search Report including Written Opinion for Application No. 21892380.3 dated Nov. 7, 2023, pp. 1-9.

International Search Report for Application No. PCT/KR2021/016581 mailed Mar. 2, 2022, pp. 1-3.

* cited by examiner

BATTERY DIAGNOSING APPARATUS AND METHOD

CROSS-REFERENCE TO RELATED APPLICATIONS

The present application is a national phase entry under 35 U.S.C. § 371 of International Application No. PCT/KR2021/016581, filed on Nov. 12, 2021, which claims priority from Korean Patent Application No. 10-2020-0152317 filed on Nov. 13, 2020, the disclosures of which are incorporated herein by reference.

TECHNICAL FIELD

The present disclosure relates to a battery diagnosing apparatus and method, and more particularly, to a battery diagnosing apparatus and method capable of diagnosing whether a side reaction occurs at a battery.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

Such a battery may be gradually degraded because a side reaction occurs as the battery is exposed to low or high temperature for a long time or as charging and discharging are repeated.

The side reaction may occur at the positive and negative electrodes of the battery, and there are various causes. Therefore, in order to increase the lifespan of the battery, it is important to check whether a side reaction of the battery occurs and what is the cause of the occurrence, and to appropriately control the usage condition of the battery accordingly.

SUMMARY

Technical Problem

The present disclosure is designed to solve the problems of the related art, and therefore the present disclosure is directed to providing a battery diagnosing apparatus and method capable of controlling a usage condition optimized for a battery by diagnosing whether a side reaction occurs in the battery and what the cause of the generated side reaction.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery diagnosing apparatus according to one aspect of the present disclosure may comprise a controller; and a memory having programmed thereon instructions that, when executed, are configured to cause the processor to: receive a differential profile representing a relationship between a voltage of a battery and a differential capacity of the battery, determine a target peak in the differential profile, compare voltages of the determined target peak and a threshold peak of a threshold profile preset for the battery, and determine occurrence of a side reaction in the battery based on the comparison.

The instructions may be configured to cause the controller to compare voltages of the threshold peak and the target peak, and determine whether the side reaction is a negative electrode side reaction or a positive electrode side reaction based on the comparison.

The instructions may be configured to cause the controller to determine occurrence of the negative electrode side reaction in the battery in response to the voltage of the target peak exceeding the voltage of the threshold peak.

The instructions may be configured to cause the controller to determine occurrence of the positive electrode side reaction in the battery in response to the voltage of the target peak being less than the voltage of the threshold peak.

The instructions may be configured to cause the controller to determine that an electrolyte included in the battery is partially decomposed in response to occurrence of the side reaction.

The instructions may be configured to cause the controller to change a usage condition of the battery in response to occurrence of the side reaction, wherein the usage condition includes at least one of a charging current rate (C-rate), an available state of charge (SOC) or an upper limit temperature for the battery.

The instructions may be configured to cause the controller to reduce an upper limit of the charging C-rate for the battery in response to determining occurrence of the negative electrode side reaction.

The instructions may be configured to cause the controller to reduce an upper limit of the available SOC for the battery in response to determining occurrence of the positive electrode side reaction.

The instructions may be configured to cause the controller to reduce the upper limit temperature for the battery in response to determining occurrence of the side reaction.

The instructions may be configured to cause the controller to determine the target peak in a predetermined voltage section of the differential profile based on the voltage of the threshold peak.

A battery pack according to another aspect of the present disclosure may comprise the battery diagnosing apparatus according to any of the embodiments of the present disclosure.

A battery inspection device according to still another aspect of the present disclosure may comprise the battery diagnosing apparatus according to any of the embodiments of the present disclosure.

A battery diagnosing method according to still another aspect of the present disclosure may comprise: obtaining a battery profile representing a corresponding relationship between voltage and capacity of a battery; receiving, by a controller, a differential profile representing a relationship between a voltage of a battery and a differential capacity of the battery; determining, by the controller, a target peak in the differential profile; comparing, by the controller, voltages of the determined target peak and a threshold peak of a threshold profile preset for the battery; and determining, by the controller, occurrence of a side reaction in the battery based on the comparison.

Advantageous Effects

According to one aspect of the present disclosure, there is an advantage in that it is possible to quickly diagnose whether a side reaction occurs in a battery and what is the type of the side reaction, based on the behavior of one peak included in the differential profile.

In addition, according to one aspect of the present disclosure, there is an advantage in that the life expectancy of the battery can be increased by setting an appropriate usage condition for the battery in which the side reaction occurs.

The effects of the present disclosure are not limited to the effects mentioned above, and other effects not mentioned will be clearly understood by those skilled in the art from the description of the claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, terms such as a control unit described in the specification mean a unit that processes at least one function or operation, which may be implemented as hardware or software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
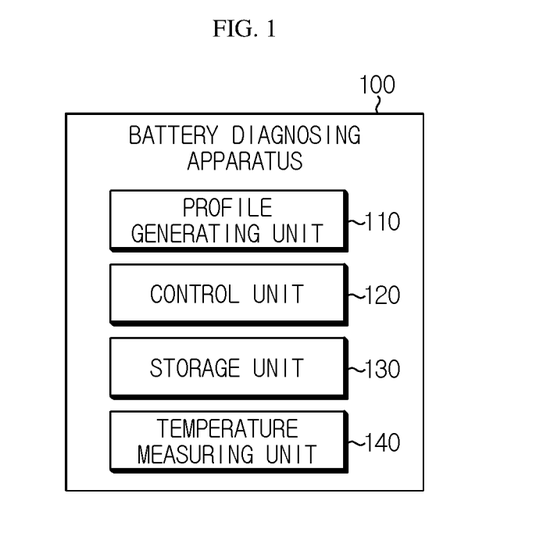
FIG. 1 is a diagram schematically showing a battery diagnosing apparatus according to an embodiment of the present disclosure.

FIG. 1 is a diagram schematically showing a battery diagnosing apparatus 100 according to an embodiment of the present disclosure.

Referring to FIG. 1, the battery diagnosing apparatus 100 may include a profile generating unit 110 and a control unit 120.

The profile generating unit 110 may be configured to obtain a battery profile representing a corresponding relationship between voltage and capacity of the battery.

Here, the battery means a physically separable one independent cell having a negative electrode terminal and a positive electrode terminal. For example, one pouch-type lithium polymer cell may be regarded as a battery.

For example, the battery profile obtained by the profile generating unit 110 may be a profile generated so that the corresponding voltage and capacity of the battery are mapped.

The profile generating unit 110 may be configured to generate a differential profile representing a corresponding relationship between the voltage and a differential capacity for the voltage based on the obtained battery profile.

The profile generating unit 110 may calculate a differential capacity (dQ/dV) by differentiating the battery capacity based on the voltage of the battery. In addition, the profile generating unit 110 may generate a differential profile representing a corresponding relationship between the voltage and the differential capacity by mapping the voltage and the differential capacity of the corresponding battery to each other.

Figure 2:
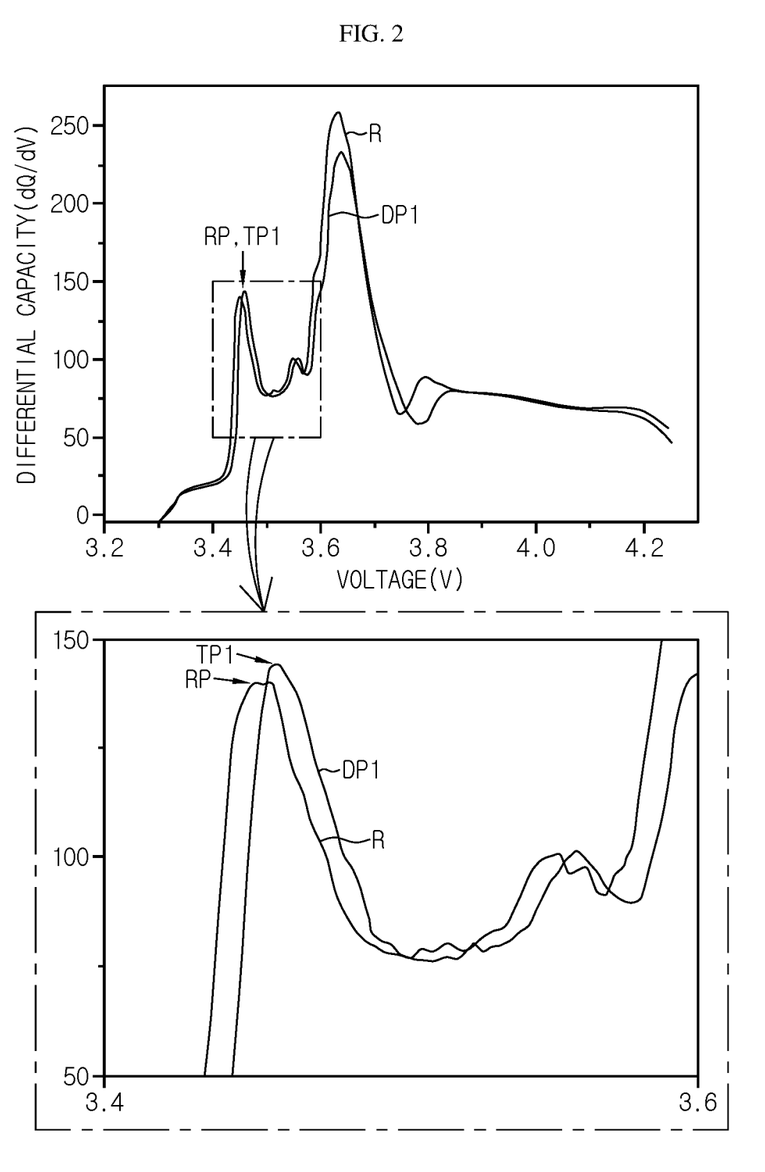
FIG. 2 is a diagram schematically showing a first differential profile and a criterion profile according to an embodiment of the present disclosure.
Figure 3:
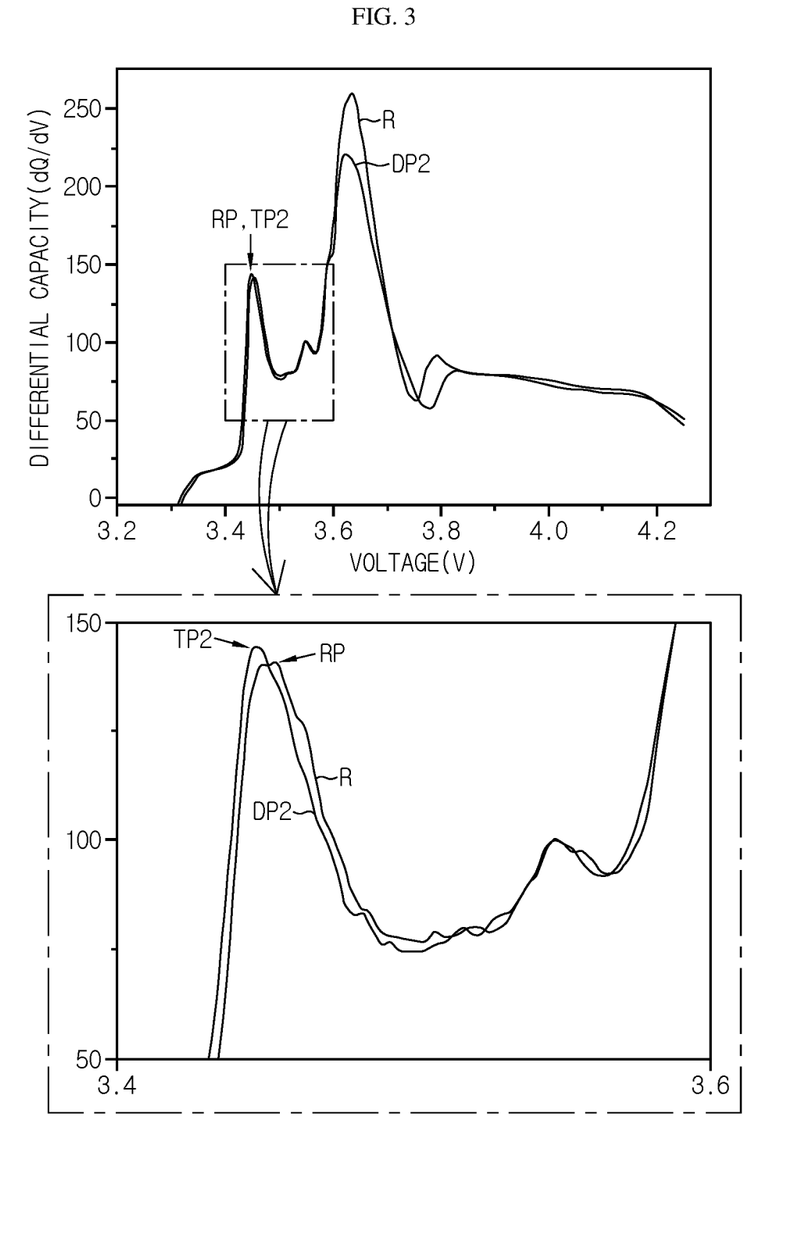
FIG. 3 is a diagram schematically showing a second differential profile and the criterion profile according to an embodiment of the present disclosure.

FIG. 2 is a diagram schematically showing a first differential profile DP1 and a criterion profile R according to an embodiment of the present disclosure. FIG. 3 is a diagram schematically showing a second differential profile DP2 and the criterion profile R according to an embodiment of the present disclosure.

For example, referring to FIGS. 2 and 3, the first differential profile DP1 and the second differential profile DP2 generated by the profile generating unit 110 may be expressed as an X-Y graph in the case where X is set to the voltage and Y is set to the differential capacity.

The control unit 120 may be configured to receive the differential profile from the profile generating unit 110.

For example, the control unit 120 and the profile generating unit 110 may be connected to each other to enable communication. The profile generating unit 110 may transmit the generated differential profile to the control unit 120, and the control unit 120 may receive the differential profile from the profile generating unit 110.

The control unit 120 may be configured to determine a target peak in the differential profile.

Specifically, the differential profile may include a plurality of peaks. Here, the peak is a point at which an instantaneous change rate of the differential capacity with respect to the voltage is 0, and may be a point at which the instantaneous change rate with respect to the peak changes from positive to negative. That is, the peak may be a point having an upward convex form in the differential profile.

The control unit 120 may determine any one of the plurality of peaks included in the differential profile as a target peak.

Preferably, the control unit 120 may be configured to determine the target peak within a predetermined voltage section based on the voltage of the criterion peak RP in the differential profile. For example, the control unit 120 may determine the target peak within the −0.1V to +0.1V section based on the voltage of the criterion peak RP. That is, if the voltage of the criterion peak RP is 3.45V, it is possible to determine the target peak within the 3.35V to 3.55V section.

For example, in the embodiment of FIG. 2, the control unit 120 may determine a plurality of peaks in the first differential profile DP1. In addition, the control unit 120 may determine a first target peak TP1 included in the predetermined voltage section based on the voltage of the criterion peak RP among the plurality of determined peaks.

As another example, in the embodiment of FIG. 3, the control unit 120 may determine a plurality of peaks in the second differential profile DP2. In addition, the control unit 120 may determine a second target peak TP2 included in the predetermined voltage section based on the voltage of the criterion peak RP among the plurality of determined peaks.

The control unit 120 may be configured to compare the voltages of the criterion peak RP of the criterion profile R preset for the battery and the determined target peak.

That is, the control unit 120 may compare the voltages corresponding to the criterion peak RP and the voltage corresponding to the target peak.

Preferably, the control unit 120 may judge whether the voltage of the target peak is different from the voltage of the criterion peak RP by a preset criterion voltage or more. For example, when the voltage and capacity of the battery are measured, an error may occur between the voltage of the target peak and an actual voltage due to a measurement error caused by noise or the like. Accordingly, the control unit 120 may judge whether the voltage of the target peak is greater than the voltage of the criterion peak RP by the criterion voltage or smaller than the voltage of the criterion peak RP by the criterion voltage, in consideration of the error.

For example, in the embodiment of FIG. 2, the control unit 120 may compare the voltages of the criterion peak RP and the first target peak TP1 to judge that the voltage of the first target peak TP1 is greater than the voltage of the criterion peak RP.

As another example, in the embodiment of FIG. 3, the control unit 120 may compare the voltages of the criterion peak RP and the second target peak TP2 to judge that the voltage of the second target peak TP2 is smaller than the voltage of the criterion peak RP.

The control unit 120 may be configured to judge whether a side reaction occurs in the battery based on the comparison result.

Specifically, the control unit 120 may be configured to judge whether a negative electrode side reaction or a positive electrode side reaction occurs in the battery according to the comparison result between the voltages of the criterion peak and the target peak.

More specifically, when the voltage of the target peak exceeds the voltage of the criterion peak, the control unit 120 may be configured to judge that the negative electrode side reaction occurs in the battery.

Conversely, when the voltage of the target peak is less than the voltage of the criterion peak, the control unit 120 may be configured to judge that the positive electrode side reaction occurs in the battery.

For example, in the embodiment of FIG. 2, the voltage of the first target peak TP1 may exceed the voltage of the criterion peak RP. Therefore, the control unit 120 may judge that the negative electrode side reaction occurs in the battery corresponding to the first differential profile DP1.

As another example, in the embodiment of FIG. 3, the voltage of the second target peak TP2 may be less than the voltage of the criterion peak RP. Therefore, the control unit 120 may judge that the positive electrode side reaction occurs in the battery corresponding to the second differential profile DP2.

The battery diagnosing apparatus 100 according to an embodiment of the present disclosure has an advantage of quickly and non-destructively diagnosing whether a side reaction occurs in the battery and what is the type of the side reaction (the positive electrode side reaction or the negative electrode side reaction), based on the behavior of one peak included in the differential profile.

Meanwhile, the control unit 120 provided to the battery diagnosing apparatus 100 may optionally include a processor, an application-specific integrated circuit (ASIC), another chipset, a logic circuit, a register, a communication modem, and a data processing device, and the like, known in the art to execute various control logics performed in the present disclosure. In addition, when the control logic is implemented in software, the control unit 120 may be implemented as a set of program modules. At this time, the program module may be stored in a memory and executed by the control unit 120. The memory may be provided in or out of the control unit 120, and may be connected to the control unit 120 by various well-known means.

In addition, the battery diagnosing apparatus 100 may further include a storage unit 130. The storage unit 130 may store data or programs necessary for operation and function of each component of the battery diagnosing apparatus 100, data generated in the process of performing the operation or function, or the like. The storage unit 130 is not particularly limited in its kind as long as it is a known information storage means that can record, erase, update and read data. As an example, the information storage means may include random access memory (RAM), flash memory, read-only memory (ROM), electrically erasable programmable read-only memory (EEPROM), registers, and the like. In addition, the storage unit 130 may store program codes in which processes executable by the control unit 120 are defined.

For example, the storage unit 130 may store the battery profile obtained by the profile generating unit 110 and the differential profile generated by the profile generating unit 110. In addition, the control unit 120 may directly receive the differential profile from the profile generating unit 110, or may access the storage unit 130 to obtain the differential profile.

Hereinafter, when it is judged that a side reaction occurs in the battery, the content of the control unit 120 to specifically diagnose the cause of the side reaction occurring in the battery will be described.

When it is judged that the negative electrode side reaction occurs, the control unit 120 may be configured to judge that some of the electrolyte contained in the battery is decomposed.

Specifically, the control unit 120 may judge that the negative electrode side reaction occurs since some of the electrolyte contained in the battery is reduced and decomposed.

As an embodiment for the negative electrode side reaction, the control unit 120 may be configured to judge that some of the electrolyte is decomposed so that lithium is precipitated on the negative electrode of the battery. That is, when it is judged that the negative electrode side reaction occurs, the control unit 120 may be configured to judge that lithium is precipitated on the negative electrode of the battery.

When the voltage of the target peak exceeds the voltage of criterion peak RP, the control unit 120 may judge that the negative electrode side reaction occurs in the battery and the negative electrode side reaction is caused by lithium plating due to the reduction decomposition of some of the electrolyte.

Specifically, when lithium plating occurs on the negative electrode of the battery, the negative electrode capacity may be lost in a high state of charge (SOC) section (e.g., SOC 90% to 100% section) of the battery. That is, metallic lithium is precipitated on the negative electrode of the battery, so that the negative electrode capacity may be lost in the high SOC section. In this case, for voltage compensation (to maintain the voltage of the battery), when charging the battery, the capacity of the low SOC section (e.g., SOC 0% to 10% section) of the negative electrode of the battery may be further used. Due to this cause, the voltage corresponding to the target peak is shifted to the high voltage, and may be greater than the criterion voltage.

That is, the form of the battery profile may be changed due to the occurrence of the negative electrode side reaction. In addition, the voltage corresponding to the target peak included in the differential profile corresponding to the battery profile with the changed form may be shifted to the high voltage.

Figure 4:
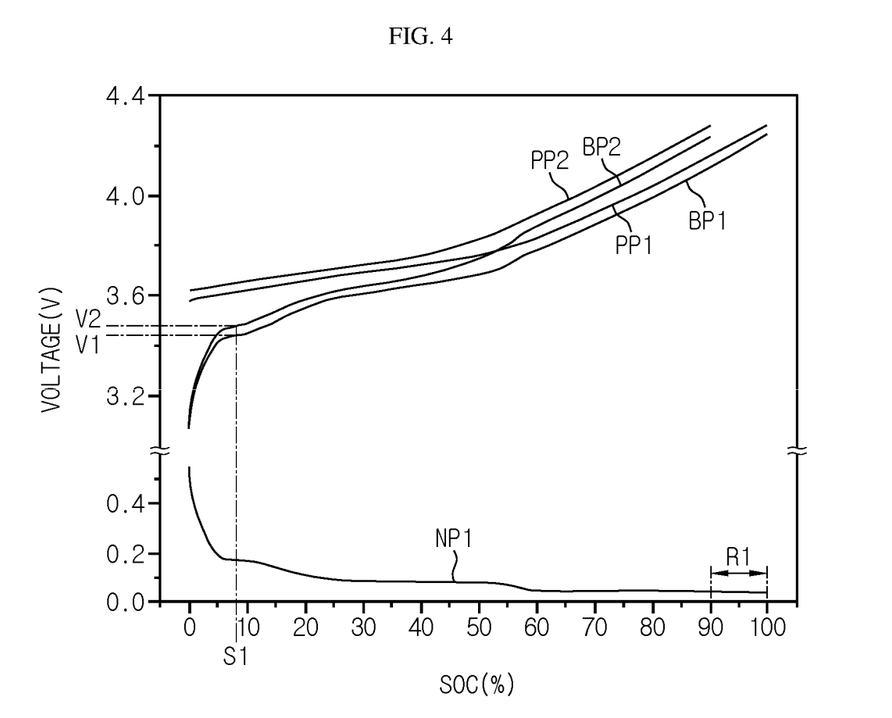
FIG. 4 is a diagram schematically showing a battery profile corresponding to the first differential profile according to an embodiment of the present disclosure.

FIG. 4 is a diagram schematically showing a battery profile corresponding to the first differential profile DP1 according to an embodiment of the present disclosure.

In the embodiment of FIG. 4, the first battery profile BP1, the first negative electrode profile NP1, and the first positive electrode profile PP1 may be profiles for a battery in a BOL (Beginning of life) state. In addition, the second battery profile BP2 and the second positive electrode profile PP2 may be profiles for a battery in a MOL (Middle of life) state. That is, when lithium plating occurs on the negative electrode of the battery, due to the loss of the negative electrode capacity in the high SOC section R1 of the battery, the first positive electrode profile PP1 is changed like the second positive electrode profile PP2, and the first battery profile BP1 may be changed like the second battery profile BP2.

In addition, in the embodiment of FIG. 4, the first SOC S1 may be a SOC for the target peak corresponding to the battery in the BOL state and the MOL state. Also, a first voltage V1 may be a voltage for the target peak corresponding to the battery in the BOL state, and a second voltage V2 may be a voltage for the target peak corresponding to the battery in the MOL state.

That is, the voltage of the first battery profile BP1 corresponding to the first SOC S1 may be the first voltage V1, and the voltage of the second battery profile BP2 corresponding to the first SOC S1 may be the second voltage V2.

Specifically, referring to FIGS. 2 and 4, the first voltage V1 of FIG. 4 may be a voltage corresponding to the criterion peak RP of FIG. 2, and the second voltage V2 may be a voltage corresponding to the first target peak TP1 of FIG. 2. That is, when lithium plating occurs on the negative electrode of the battery, since the voltage corresponding to the first target peak TP1 is shifted to the high voltage, the voltage of the first target peak TP1 may be greater than the voltage of the criterion peak RP.

Therefore, when the voltage of the target peak exceeds the criterion voltage, the control unit 120 may judge that the negative electrode side reaction occurs in the battery, may also specifically diagnose that the cause of the negative electrode side reaction is lithium plating generated on the negative electrode.

The control unit 120 may be configured to judge that some of the electrolyte contained in the battery is decomposed, when it is judged that the positive electrode side reaction occurs.

Specifically, the control unit 120 may judge that some of the electrolyte contained in the battery is oxidatively decomposed and thus the positive electrode side reaction occurs.

In general, when the battery is exposed to high temperatures for a long period of time, the electrolyte contained in the battery is decomposed, and lithium ions may be supplied from the decomposed electrolyte to the positive electrode. In this case, the positive electrode may receive the lithium ion from the negative electrode and the decomposed electrolyte. Therefore, as the lithium ion is supplied from the negative electrode and the decomposed electrolyte, the high-voltage capacity of the positive electrode of the battery may not be used.

In an embodiment for the positive electrode side reaction, the control unit 120 may be configured to judge that some of the electrolyte is decomposed and thus the non-use capacity of the positive electrode of the battery is increased.

Specifically, when a part of the electrolyte contained in the battery is oxidatively decomposed, the lithium ion released from the decomposed electrolyte may be supplied to the positive electrode. In this case, since the positive electrode self-discharges in the high SOC section (e.g., SOC 90% to 100% section), the positive electrode side reaction may occur in which the high SOC section of the positive electrode is not used during battery charging.

In addition, since the positive electrode is not used in the high SOC section due to the positive electrode side reaction, the low SOC section of the positive electrode may be further used for voltage compensation during battery charging. Therefore, the form of the battery profile may be changed due to the positive electrode side reaction. In addition, the voltage corresponding to the target peak included in the differential profile corresponding to the battery profile with the changed form may be shifted to the low voltage.

Figure 5:
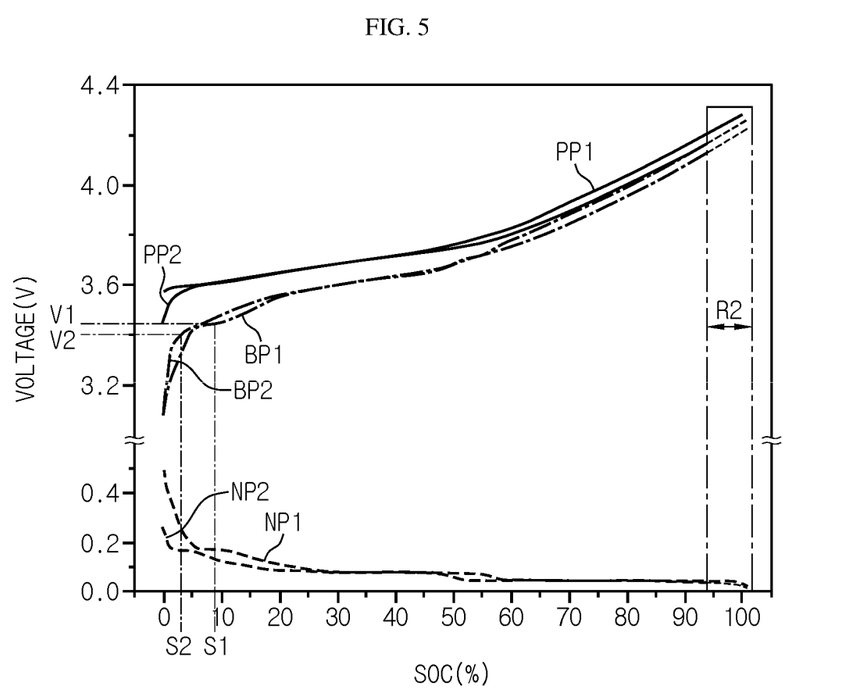
FIG. 5 is a diagram schematically showing a battery profile corresponding to the second differential profile according to an embodiment of the present disclosure.

FIG. 5 is a diagram schematically showing a battery profile corresponding to the second differential profile DP2 according to an embodiment of the present disclosure.

In the embodiment of FIG. 5, the first battery profile BP1, the first negative electrode profile NP1, and the first positive electrode profile PP1 may be profiles for a battery in a BOL state. In addition, the second battery profile BP2, the second negative electrode profile NP2, and the second positive electrode profile PP2 may be profiles for a battery in a MOL state. That is, when the positive electrode side reaction occurs in the battery, the positive electrode in the high SOC section R2 is not used, so the first positive electrode profile PP1 may be changed like the second positive electrode profile PP2, the first negative electrode profile NP1 may be like the second negative electrode profile NP2, and the first battery profile BP1 may be changed like the second battery profile BP2.

In the embodiment of FIG. 5, the first SOC S1 and the first voltage V1 are SOC and voltage for the target peak corresponding to the battery in the BOL state, and the second SOC S2 and the second voltage V2 are SOC and voltage for the target peak corresponding to the battery in the MOL state.

On the other hand, in the embodiment of FIG. 5, the second positive electrode profile PP2, the second negative electrode profile NP2, and the second battery profile BP2 are indicated by dotted lines in the high SOC section R2 to express that the positive electrode is not used in the high SOC section R2.

That is, the voltage of the first battery profile BP1 corresponding to the first SOC S1 may be the first voltage V1, and the voltage of the second battery profile BP2 corresponding to the second SOC S2 may be the second voltage V2.

Specifically, referring to FIGS. 3 and 5, the first voltage V1 of FIG. 5 may be a voltage corresponding to the criterion peak RP of FIG. 3, and the second voltage V2 may be a voltage corresponding to the second target peak TP2 of FIG. 3. That is, when a side reaction occurs in the positive electrode of the battery, the voltage corresponding to the second target peak TP2 is shifted to the low voltage, so the voltage of the second target peak TP2 may be smaller than the voltage of the criterion peak RP.

Therefore, if the voltage of the target peak is less than the criterion voltage, the control unit 120 may judge that the positive electrode side reaction occurs in the battery as well as specifically diagnose that the positive electrode side reaction is caused since some of the electrolyte contained in the battery is oxidatively decomposed.

Referring to FIG. 1, the battery diagnosing apparatus 100 according to an embodiment of the present disclosure may further include a temperature measuring unit 140.

The temperature measuring unit 140 may be configured to measure the temperature of the battery. For example, the temperature measuring unit 140 may periodically measure the temperature of the battery, and when a temperature measurement signal is input, the temperature of the battery may be measured even without the temperature measurement period.

The temperature information of the battery measured by the temperature measuring unit 140 may be accumulatively stored in the storage unit 130.

The control unit 120 may judge whether the battery is exposed to high temperature for a long period of time in consideration of the temperature information of the battery stored in the storage unit 130. If the battery is maintained in a state of the criterion temperature or above for a long period of time, the control unit 120 may judge that the positive electrode side reaction occurring in the battery is caused by the decomposition of the electrolyte due to exposure to high temperature.

On the other hand, when it is judged that a side reaction occurs in the battery, the control unit may be configured to change usage condition including at least one of a charging C-rate (Current rate), an available SOC, and an upper limit temperature for the battery.

Specifically, when it is judged that the negative electrode side reaction occurs, the control unit 120 may be configured to reduce the upper limit of the charging C-rate for the battery.

As described above, the control unit 120 may judge that the negative electrode side reaction is caused due to lithium plating generated on the negative electrode of the battery. Accordingly, the control unit 120 may reduce the upper limit of the charging C-rate for the battery in order to prevent lithium plating from being further generated on the negative electrode.

Preferably, the control unit 120 may reduce the upper limit of the charging C-rate for the battery as well as the upper limit of the discharging C-rate to prevent lithium plating from occurring.

In addition, when it is judged that the positive electrode side reaction occurs, the control unit 120 may be configured to reduce the upper limit of the available SOC for the battery.

As described above, the control unit 120 may judge that the positive electrode side reaction is caused by the oxidative decomposition of the electrolyte contained in the battery. Accordingly, the control unit 120 may reduce the upper limit of the available SOC of the battery in order to prevent further decomposition of the electrolyte.

In addition, when it is judged that the side reaction occurs in the battery, the control unit 120 may be configured to reduce the upper limit temperature for the battery.

That is, when it is judged that the negative electrode side reaction or the positive electrode side reaction occurs in the battery, the control unit 120 may be configured to decrease the upper limit temperature for the battery in order to suppress the occurrence of the side reaction.

Therefore, the battery diagnosing apparatus 100 according to an embodiment of the present disclosure has an advantage of specifically diagnosing whether a side reaction occurs in the battery and what is the type of the side reaction, and setting an optimal usage condition for the battery according to the diagnosis result. When the battery is operated under the usage condition set by the battery diagnosing apparatus 100, the occurrence of a side reaction in the battery may be suppressed (or delayed), and consequently, the lifespan of the battery may be increased.

The battery diagnosing apparatus 100 according to an embodiment of the present disclosure may be applied to a BMS (Battery Management System). That is, the BMS according to the present disclosure may include the battery diagnosing apparatus 100 described above. In this configuration, at least some components of the battery diagnosing apparatus 100 may be implemented by supplementing or adding functions of the configuration included in the conventional BMS. For example, the profile generating unit 110, the control unit 120, the storage unit 130 and the temperature measuring unit 140 of the battery diagnosing apparatus 100 may be implemented as components of the BMS.

In addition, the battery diagnosing apparatus 100 according to an embodiment of the present disclosure may be provided to a battery pack. That is, the battery pack according to the present disclosure may include the above-described battery diagnosing apparatus 100 and at least one battery cell. In addition, the battery pack may further include electrical equipment (a relay, a fuse, etc.) and a case.

That is, an optimal usage condition for the battery is set by the battery diagnosing apparatus 100 included in the battery pack, and the battery included in the battery pack may be operated according to the set usage condition.

Therefore, a side reaction is prevented from occurring in the battery, and the lifespan of the battery may be increased.

In addition, the battery diagnosing apparatus 100 according to an embodiment of the present disclosure may be included in a battery inspection device. The battery inspection device may diagnose whether a side reaction occurs in the battery and what is the type of the side reaction, and set an optimal usage condition for the battery. The usage condition set by the battery inspection device may be stored in a server and/or a BMS of the battery pack to which the battery is to be provided. Therefore, the battery may be operated according to the set usage condition.

Figure 6:
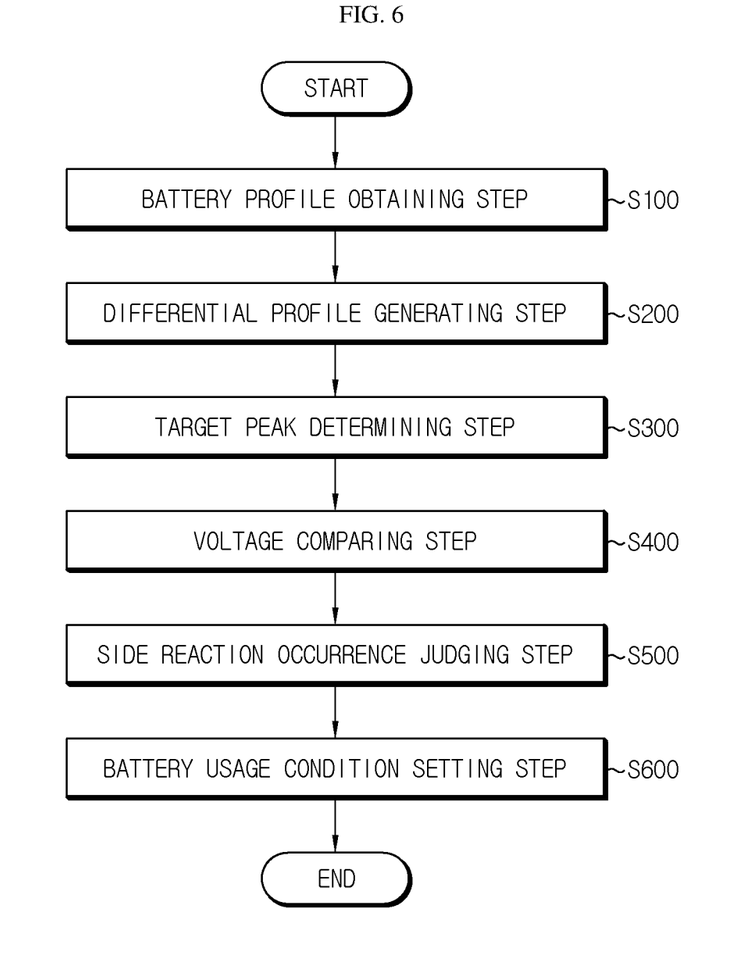
FIG. 6 is a diagram schematically showing a battery diagnosing method according to another embodiment of the present disclosure.

FIG. 6 is a diagram schematically showing a battery diagnosing method according to another embodiment of the present disclosure.

Preferably, each step of the battery diagnosing method may be performed by the battery diagnosing apparatus 100. Hereinafter, for convenience of description, content overlapping with the previously described content will be omitted or briefly described.

Referring to FIG. 6, the battery diagnosing method may include a battery profile obtaining step (S100), a differential profile generating step (S200), a target peak determining step (S300), a voltage comparing step (S400), a side reaction occurrence judging step (S500) and a battery usage condition setting step (S600).

The battery profile obtaining step (S100) is a step of obtaining a battery profile representing a corresponding relationship between voltage and capacity of a battery, and may be performed by the profile generating unit 110.

For example, in the embodiment of FIG. 4, the profile generating unit 110 may obtain a second battery profile BP2.

As another example, in the embodiment of FIG. 5, the profile generating unit 110 may acquire the second battery profile BP2.

The differential profile generating step (S200) is a step of generating a differential profile representing a corresponding relationship between the voltage and a differential capacity for the voltage based on the battery profile obtained in the battery profile obtaining step (S100), and may be performed by the profile generating unit 110.

For example, in the embodiment of FIG. 2, the profile generating unit 110 may generate a first differential profile DP1 based on the obtained battery profile.

As another example, in the embodiment of FIG. 3, the profile generating unit 110 may generate a second differential profile DP2 based on the acquired battery profile.

The target peak determining step (S300) is a step of determining a target peak from the differential profile generated in the differential profile generating step (S200), and may be performed by the control unit 120.

For example, in the embodiment of FIG. 2, the control unit 120 may determine a first target peak TP1 within a predetermined voltage section from the voltage of a criterion peak RP in the first differential profile DP1.

As another example, in the embodiment of FIG. 3, the control unit 120 may determine a second target peak TP2 within a predetermined voltage section from the voltage of the criterion peak RP in the second differential profile DP2.

The voltage comparing step (S400) is a step of comparing the voltages of the criterion peak RP of the criterion profile R preset for the battery and the determined target peak, and may be performed by the control unit 120.

For example, in the embodiment of FIG. 2, the control unit 120 may judge that the voltage corresponding to the first target peak TP1 is greater than the voltage corresponding to the criterion peak RP.

As another example, in the embodiment of FIG. 3, the control unit 120 may judge that the voltage corresponding to the second target peak TP2 is smaller than the voltage corresponding to the criterion peak RP.

The side reaction occurrence judging step (S500) is a step of judging whether a negative electrode side reaction or a positive electrode side reaction occurs in the battery based on the comparison result of the voltage comparing step (S400), and may be performed by the control unit 120.

Specifically, when the voltage of the target peak exceeds the voltage of the criterion peak, the control unit 120 may judge that the negative electrode side reaction occurs in the battery. Conversely, when the voltage of the target peak is less than the voltage of the criterion peak, the control unit 120 may judge that the positive electrode side reaction occurs in the battery.

For example, in the embodiment of FIG. 2, since the voltage of the first target peak TP1 exceeds the voltage of the criterion peak RP, the control unit 120 may judge that the negative electrode side reaction occurs in the battery.

As another example, in the embodiment of FIG. 3, since the voltage of the second target peak TP2 is less than the voltage of the criterion peak RP, the control unit 120 may judge that the positive electrode side reaction occurs in the battery.

After the side reaction occurrence judging step (S500), a battery usage condition setting step (S600) may be further included.

The battery usage condition setting step (S600) is a step of setting a usage condition for the battery when it is judged that a side reaction occurs in the battery, and may be performed by the control unit 120.

Specifically, when it is judged that a side reaction occurs in the battery, the control unit 120 may change the usage condition including at least one of a charging C-rate, an available SOC and an upper limit temperature for the battery. Accordingly, as the battery operates according to the changed usage condition, the lifespan of the battery may be increased.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

100: battery diagnosing apparatus
110: profile generating unit

120: control unit
130: storage unit
140: temperature measuring unit

What is claimed is:

1. A battery diagnosing apparatus, comprising:
a controller; and
memory having programmed thereon instructions that, when executed, are configured to cause the controller to:
receive a differential profile representing a relationship between a voltage of a battery and a differential capacity of the battery;
determine a target peak among one or more peaks in the differential profile from among a plurality of candidate peaks in the differential profile based on a voltage of a threshold peak of a threshold profile preset for the battery, wherein the determination is based on the voltage of the target peak and the voltage of the threshold peak being within a predetermined amount of one another;
compare voltages of the determined target peak and the threshold peak of the threshold profile; and
determine occurrence of a side reaction in the battery based on the comparison.

2. The battery diagnosing apparatus according to claim 1, wherein the instructions are configured to cause the controller to determine the target peak in a predetermined voltage section of the differential profile based on the voltage of the threshold peak.

3. A battery pack, comprising the battery diagnosing apparatus according to claim 1.

4. A battery inspection device, comprising the battery diagnosing apparatus according to claim 1.

5. A battery diagnosing apparatus, comprising:
a controller; and
memory having programmed thereon instructions that, when executed, are configured to cause the controller to:
receive a differential profile representing a relationship between a voltage of a battery and a differential capacity of the battery;
determine a target peak among one or more peaks in the differential profile;
compare voltages of the determined target peak and a threshold peak of a threshold profile preset for the battery; and
determine occurrence of a side reaction in the battery and whether the side reaction is a negative electrode side reaction or a positive electrode side reaction based on the comparison.

6. The battery diagnosing apparatus according to claim 5, wherein the instructions are configured to cause the controller to:
determine occurrence of the negative electrode side reaction in the battery in response to the voltage of the target peak exceeding the voltage of the threshold peak; and
determine occurrence of the positive electrode side reaction in the battery in response to the voltage of the target peak being less than the voltage of the threshold peak.

7. The battery diagnosing apparatus according to claim 5, wherein the instructions are configured to cause the controller to determine that an electrolyte included in the battery is partially decomposed in response to occurrence of the side reaction.

8. The battery diagnosing apparatus according to claim 5, wherein the instructions are configured to cause the controller to change a usage condition of the battery in response to occurrence of the side reaction, wherein the usage condition includes at least one of a charging current rate (C-rate), an available state of charge (SOC) or an upper limit temperature for the battery.

9. The battery diagnosing apparatus according to claim 6, wherein the instructions are configured to cause the controller to:
reduce an upper limit of the charging C-rate for the battery in response to determining occurrence of the negative electrode side reaction; and
reduce an upper limit of the available SOC for the battery in response to determining occurrence of the positive electrode side reaction.

10. The battery diagnosing apparatus according to claim 6, wherein the instructions are configured to cause the controller to reduce the upper limit temperature for the battery in response to determining occurrence of the side reaction.

11. The battery diagnosing apparatus according to claim 5, wherein the instructions are configured to cause the controller to determine the target peak in a predetermined voltage section of the differential profile based on the voltage of the threshold peak.

12. A battery pack, comprising the battery diagnosing apparatus according to claim 5.

13. A battery inspection device, comprising the battery diagnosing apparatus according to claim 5.

14. The battery diagnosing apparatus according to claim 5, wherein the instructions are configured to cause the controller to determine the target peak in the differential profile from among a plurality of candidate peaks in the differential profile based on a voltage of the threshold peak of the threshold profile, wherein the voltage of the target peak and the voltage of the threshold peak are within a predetermined amount of one another.

15. A battery diagnosing method, comprising:
obtaining a battery profile representing a corresponding relationship between voltage and capacity of a battery;
receiving, by a controller, a differential profile representing a relationship between a voltage of a battery and a differential capacity of the battery;
determining, by the controller, a target peak among one or more peaks in the differential profile from among a plurality of candidate peaks in the differential profile based on a voltage of a threshold peak of a threshold profile preset for the battery, wherein the determination is based on the voltage of the target peak and the voltage of the threshold peak being within a predetermined amount of one another;
comparing, by the controller, voltages of the determined target peak and the threshold peak of the threshold profile; and
determining, by the controller, occurrence of a side reaction in the battery based on the comparison.

16. A battery diagnosing method, comprising:
obtaining a battery profile representing a corresponding relationship between voltage and capacity of a battery;
receiving, by a controller, a differential profile representing a relationship between a voltage of a battery and a differential capacity of the battery;
determining, by the controller, a target peak among one or more peaks in the differential profile from among a plurality of candidate peaks in the differential profile based on a voltage of a threshold peak of a threshold profile preset for the battery, wherein the determination is based on the voltage of the target peak and the voltage of the threshold peak being within a predetermined amount of one another;

comparing, by the controller, voltages of the determined target peak and the threshold peak of the threshold profile; and determining, by the controller, occurrence of a side reaction in the battery and whether the side reaction is a negative electrode side reaction or a positive electrode side reaction based on the comparison.

* * * * *